United States Patent [19]
Taylor et al.

[11] Patent Number: 5,159,216
[45] Date of Patent: Oct. 27, 1992

[54] PRECISION TRISTATE OUTPUT DRIVER CIRCUIT HAVING A VOLTAGE CLAMPING FEATURE

[75] Inventors: Stewart S. Taylor, Beaverton; Chanh M. Nguyen, Tualatin, both of Oreg.

[73] Assignee: TriQuint Semiconductor, Inc., Beaverton, Oreg.

[21] Appl. No.: 603,338

[22] Filed: Oct. 25, 1990

[51] Int. Cl.$^5$ ............... H03K 19/00; H03K 19/21
[52] U.S. Cl. ............... 307/473; 307/475; 307/450
[58] Field of Search ............... 307/443, 475, 473, 451, 307/455, 546–548, 450

[56] References Cited

U.S. PATENT DOCUMENTS

| | | | |
|---|---|---|---|
| 4,363,978 | 12/1982 | Heimbigner | 307/473 |
| 4,801,825 | 1/1989 | Stanley et al. | 307/473 |
| 4,808,853 | 2/1989 | Taylor | 307/473 |
| 4,814,638 | 3/1989 | Weick | 307/473 X |
| 4,864,166 | 9/1989 | Gloaguen | 307/473 X |
| 4,939,392 | 7/1990 | Shubat et al. | 307/473 |
| 5,001,369 | 3/1991 | Lee | 307/473 |
| 5,051,623 | 9/1991 | Yarbrough et al. | 307/473 |

*Primary Examiner*—Edward P. Westin
*Assistant Examiner*—Andrew Sanders
*Attorney, Agent, or Firm*—Skjerven, Morrill, MacPherson, Franklin & Friel

[57] ABSTRACT

A tristate output driver circuit (30, 40, 50) includes first (Q7) and second (Q8) switches for selectively connecting a logic high voltage source (VH) or a logic low voltage source (VL) to an output terminal (12) in a first, connected mode. Control nodes (14, 16) on the first and second switches (Q7, Q8) are energized in a precise, symmetrical manner to prevent multiple slopes in the output waveform by a precision input stage (31) that includes cascode outputs (Q17, Q18), cascode current sources (Q19–Q20, Q21–Q22) and bootstrapped current sources (32, 34). In a second, tristate mode, the output terminal (12) is electrically isolated from the logic high (VH) and logic low voltage sources (VL). In the tristate mode, the off-switch remains off and the on-switch is turned off by the precision input stage (31) to minimize glitches in the output waveform. A voltage clamping circuit (41, 43) clamps the control nodes (14, 16) of the switches (Q7, Q8) to a voltage more negative than a termination voltage source (Vterm), the logic low voltage source (VL), or the logic high voltage source (VH) in order that the electrical isolation of the tristate mode is maintained regardless of the value of the termination voltage (Vterm).

24 Claims, 6 Drawing Sheets

PRECISION TRISTATE OUTPUT DRIVER CIRCUIT HAVING A VOLTAGE CLAMPING FEATURE

BACKGROUND OF THE INVENTION

The present invention relates in general to output driver circuits for providing a high or low voltage at an output terminal and more particularly to output driver circuits having a tristate output mode that electrically isolates the output terminal.

Figure 1:
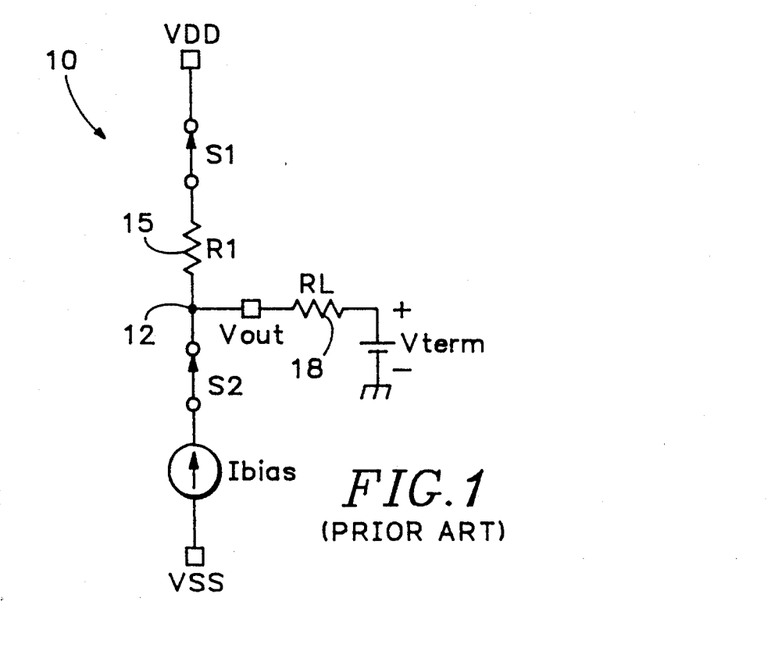

A schematic diagram of an equivalent circuit of one type of a typical prior art tristate driver circuit 10 is shown in FIG. 1. The circuit includes two switches, S1 and S2, that serve to couple the output 12 to a high logic voltage, to a low logic voltage, or to electrically isolate the output 12. Resistors 15 and 18, current source Ibias, and termination voltage source Vterm determine the value of the high logic and low logic voltages that are coupled to the output terminal 12. In a first state, switch S1 is closed and switch S2 is open. Assuming that the value RL of the load resistor 18 is large with respect to the value R1 of resistor 15, the voltage Vout at the output 12 is a high logic voltage VH that is slightly less than the positive power supply voltage, VDD, as long as Vterm is less than VDD. In a second state, switches S1 and S2 are both closed. The voltage Vout at the output 12 is a low logic voltage VL greater than the negative power supply voltage, VSS. The approximate value of VL is equal to $VDD - Ibias \times R1$. In a third, high impedance tristate mode, both of the switches S1 and S2 are open to electrically isolate the output terminal 12 from the positive power supply voltage VDD and the negative power supply voltage VSS. The output terminal 12 is coupled only to the termination voltage supply Vterm through load resistor 18. Since the output terminal 12 is electrically isolated from the rest of the driver circuit 10, the voltage Vout at the output terminal 12 is equal to Vterm.

In order that the driver circuit 10 of FIG. 1 switch in a smooth manner (no voltage spikes or "glitches") from either the first or second state to the tristate, both switches S1 and S2 must be opened at precisely the same time. If one switch is opened while the other switch is still closed, the output 12 can temporarily switch from a true (valid) logic state to another false (invalid) logic state before the termination voltage is reached. A temporary false logic state can produce an incorrect output in a subsequent circuit coupled to the output terminal 12. Alternatively, the output terminal 12 can reach a voltage that overstresses the driver circuit 10 or subsequent circuits coupled to the output terminal 12.

As an example, the output of the driver circuit 10 is at VL when switches S1 and S2 are closed. To obtain the high impedance tristate, switches S1 and S2 must be subsequently opened at precisely the same time. If switch S1 opens before S2, current source Ibias pulls Vout negative, creating an undesirable negative going spike that is lower than VL. When switch S2 finally opens, the negative going spike settles out. The output 12 is then electrically isolated from the power supply voltages VDD and VSS and Vout settles to Vterm. Alternatively, if switch S2 opens before S1, resistor 15 pulls Vout toward the positive power supply voltage VDD, creating a temporary false high logic level at the output 12. When switch S1 finally opens, the positive going spike settles out. The output 12 is again electrically isolated from the power supply voltages VDD and VSS and Vout settles to Vterm.

Figure 2:
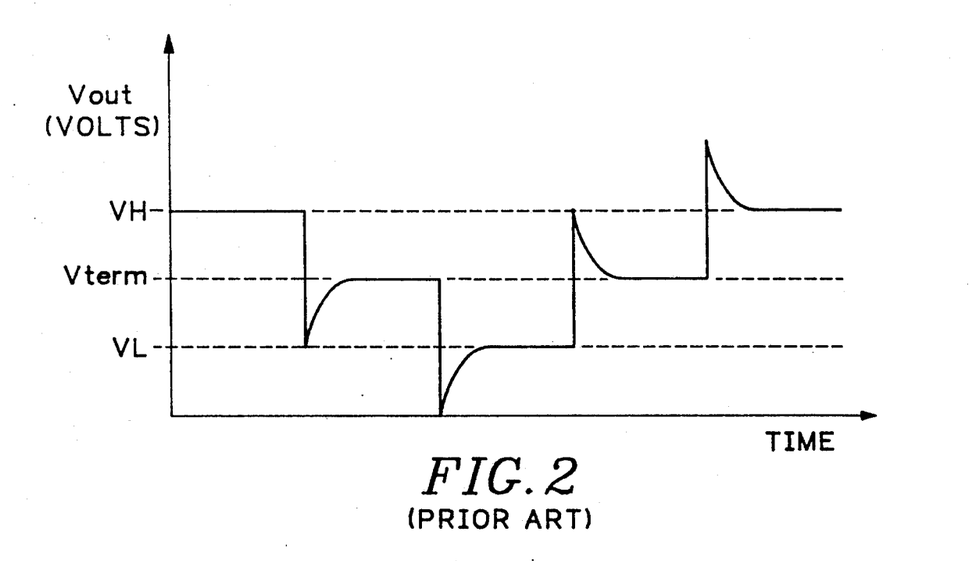
FIG. 2 is a graph showing undesirable voltage spikes produced by the prior art circuit of FIG. 1.

The graph in FIG. 2 illustrates the possible undesirable transitions between the high logic voltage VH, the low logic voltage VL, and the termination voltage Vterm. For purposes of illustrating the behavior of driver circuit 10 only, Vterm is assumed to be halfway between VH and VL. FIG. 2 shows a negative going spike creating a false low logic state from VH to Vterm, a negative going spike overstressing the circuit from Vterm to VL, a positive going spike creating a false logic state from VL to Vterm, and a positive going spike overstressing the circuit from Vterm to VH.

Figure 3:
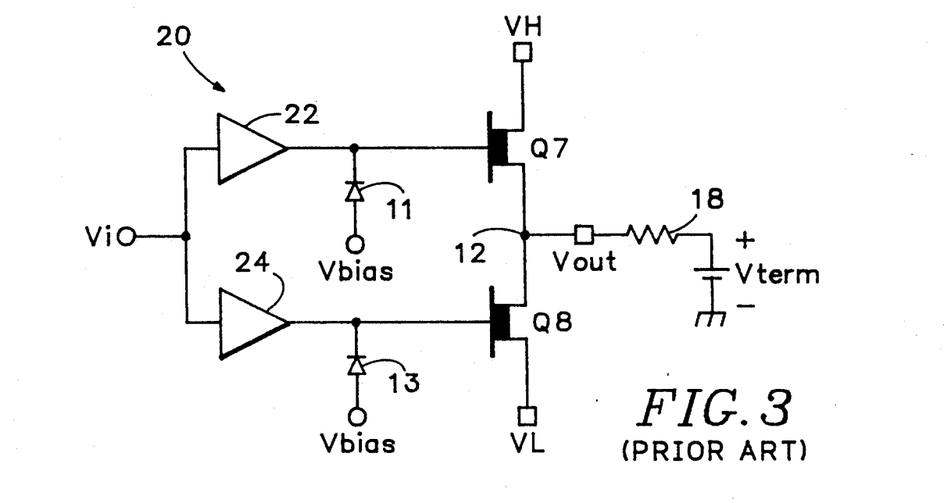
FIG. 3 is a schematic diagram of another type of a prior art driver circuit.

A second type of prior art driver circuit 20 is shown in FIG. 3 having a voltage clamping feature. The mechanism for placing driver circuit 20 into the tristate mode is not shown. The driver circuit 20 includes a buffer stage 22 and an inverter stage 24 having inputs coupled together and to the input voltage, Vi. The outputs of buffer stage 22 and inverter stage 24 are respectively coupled to transistors Q7 and Q8 that are configured as output switches. Transistors Q7 and Q8 are shown as metal-semiconductor field-effect transistors ("MESFETS"), but other types of field-effect ("FETS") transistors are used. Transistors Q7 and Q8 are alternatively switched according to the polarity of the input voltage, Vi. Thus, transistors Q7 and Q8 couple either the high logic voltage VH or the low logic voltage VL to the output terminal 12.

Figure 4:
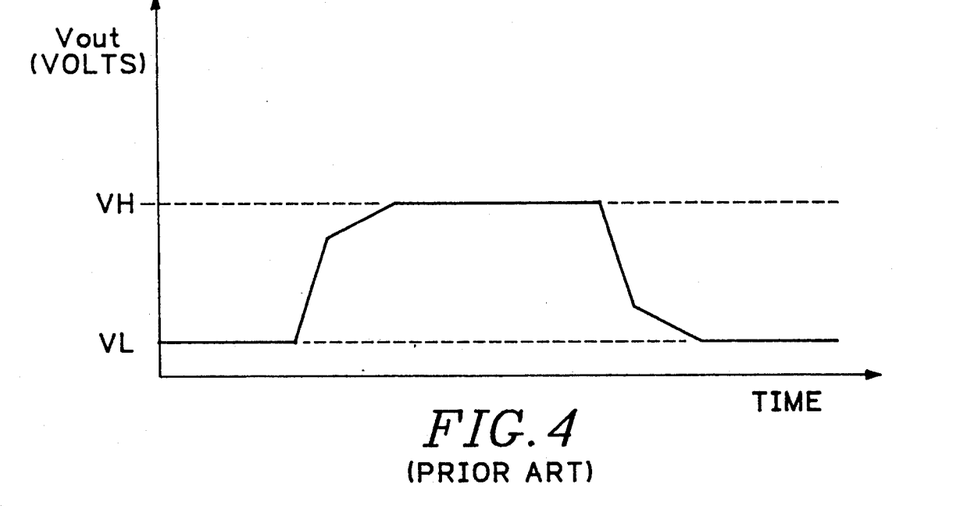
FIG. 4 is a graph showing undesirable multiple slopes produced by the prior art circuit of FIG. 3.

In the prior art driver circuit 20 of FIG. 3, the switching waveforms at the output of buffer stage 22 and inverter stage 24 should ideally be precisely complementary. If this is not the case, the output waveform Vout, shown in FIG. 4, can exhibit undesirable multiple slopes or "kinks" when switched from the high logic level VH to the low logic level VL.

Also in prior art driver circuit 20 of FIG. 3, a voltage clamp is typically used to clamp the gates of transistors Q7 and Q8 (nodes 14 and 16) to a negative fixed potential in the tristate mode to ensure that transistors Q7 and Q8 are off and the value of nodes 14 and 16 is set to a predetermined value. The voltage clamp includes diodes 11 and 12 and the fixed potential Vbias. As mentioned above, FETs are typically used for the output switching transistors Q7 and Q8. Since FETs are symmetrical devices, the drain and source of the device are determined by the applied voltage and therefore the drain and source can become exchanged. Thus, the problem with a fixed potential clamp is that the clamp may not limit current for all values of the termination voltage, Vterm. For example, if it is assumed that VL=0 volts, Vbias=−3 volts, Vterm is greater than 0 volts, and transistor Q8 is a normally on depletion FET with a pinch-off voltage, Vp, of −0.7 volts, then transistor Q8 is off. However, if Vterm becomes more negative than Vbias, the drain and source of transistor Q8 reverse, and the clamp voltage Vbias does not turn off transistor Q8, but rather allows transistor Q8 to conduct current from VL to Vterm.

A third type of prior art tristate driver circuit (not shown) has a series-connected switch at the output terminal that is opened when the tristate mode is desired. Placing an additional switch in series with the output undesirably increases the output impedance of the driver circuit in a manner that is poorly controlled due to the variability of the series resistance of FET switching elements. Additionally, bias current flowing through the series-connected switch can create an excess voltage drop across circuit elements such as the load resistor.

What is desired is a tristate output driver circuit that does not have undesirable glitches or multiple slopes in the output, remains in the tristate mode for a broad range of the termination voltage, and does not require a series-connected output switch.

SUMMARY OF THE INVENTION

In accordance with the present invention, a tristate output driver circuit includes first and second switches for selectively connecting a logic high voltage source or a logic low voltage source to an output terminal in a first, connected mode. In the connected mode either the first switch is on and the second switch is off or the second is on and the first switch is off. Control nodes on the first and second switches are energized in a precise, symmetrical manner to minimize multiple slopes in the output waveform. This precision is achieved by the use of cascoded and bootstrapped current sources in a precision input stage that is coupled to the control nodes of the first and second switches. In a second, disconnected or tristate mode, the output terminal is electrically isolated from the logic high and logic low voltage sources. In the tristate mode, the off-switch remains off and the on-switch is turned off by the precision input-stage. Therefore, glitches due to simultaneously opening two closed switches are minimized in the output waveform since only one switch is opened. A voltage clamping circuit clamps the control nodes of the switches to a voltage more negative than the termination voltage source, the logic low voltage source, or the logic high voltage source in order that the electrical isolation of the tristate mode is maintained regardless of the value of the termination voltage.

It is an object of the present invention to smoothly switch a tristate driver circuit into and out of the tristate mode without producing intermediate false logic states.

It is a further object of the present invention to smoothly switch a tristate driver circuit into and out of the tristate mode without overstressing the driver circuit or any subsequent circuits.

It is a further object of the present invention to switch a tristate driver circuit directly from one logic state to another logic state without producing undesirable multiple slopes in the output waveform.

It is a further object of the present invention to provide a tristate mode in a tristate driver circuit without using a series-connected output switching element.

It is a further object of the present invention to provide a tristate mode that maintains electrical isolation of the output terminal even if the termination voltage is greater than the logic high voltage supply or less than the logic low voltage supply.

BRIEF DESCRIPTION OF THE DRAWINGS

FIG. I is a schematic diagram of an equivalent circuit of one type of a prior art tristate driver circuit.

DESCRIPTION OF PREFERRED EMBODIMENTS

Figure 5:
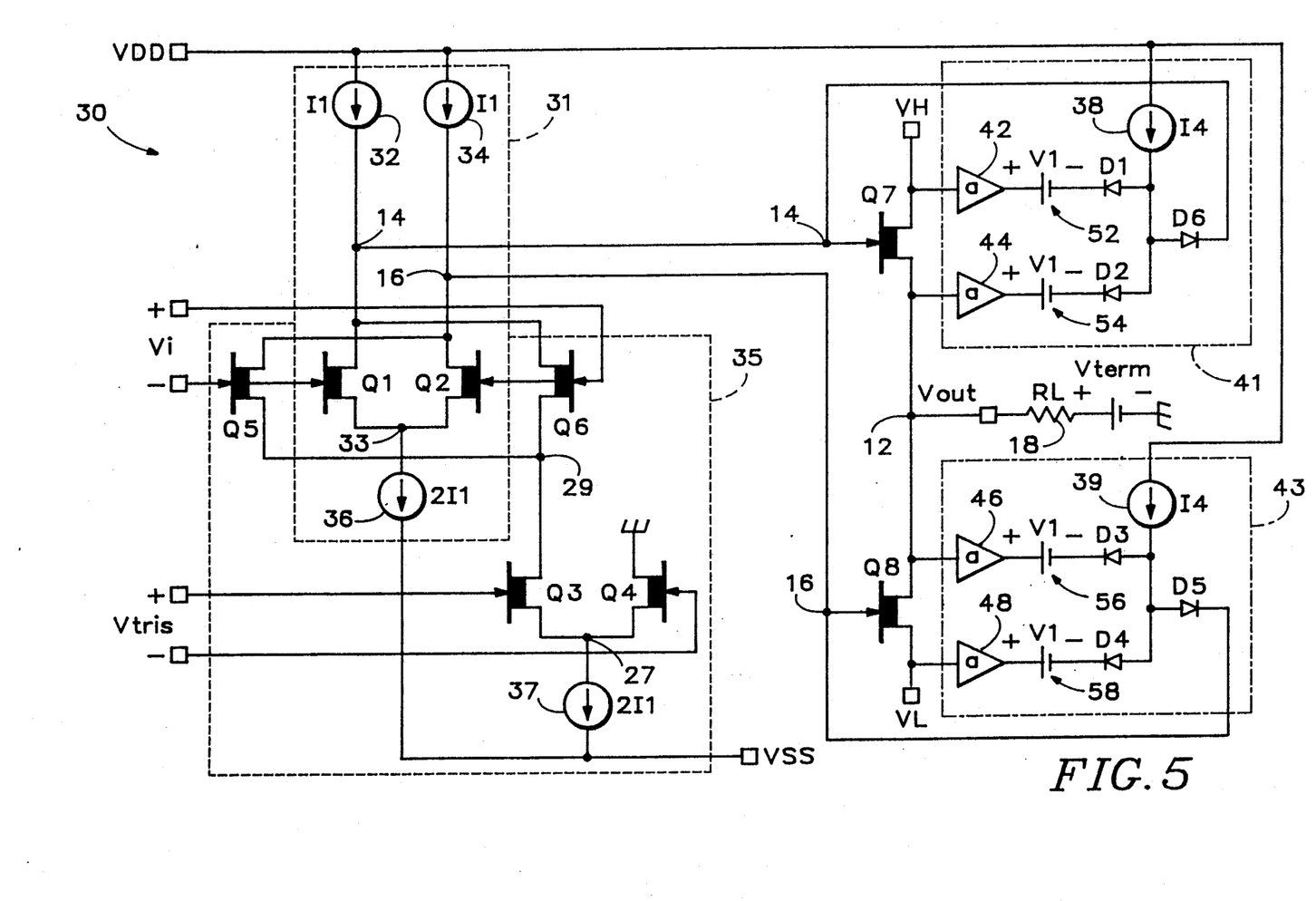
FIG. 5 is a schematic diagram of a tristate driver circuit according to one embodiment of the present invention.

A first embodiment of a tristate output driver circuit 30 according to the present invention is shown in FIG. 5. A voltage Vout appears at output terminal 12 and a load such as resistor RL is coupled between the output terminal 12 and a termination voltage source Vterm. A first switch Q7 is coupled between a first voltage source VH and the output terminal 12. The first voltage source VH is typically a high logic voltage such as five volts. The first switch Q7 includes a control node 14. The first switch Q7 is shown as a MESFET wherein the control node is the gate. A second switch Q8 is coupled between a second voltage source VL and the output terminal 12. The second voltage source VL is typically a low logic voltage such as ground. The second switch includes a control node 16. The second switch Q8 is also shown as a MESFET wherein the control node is the gate. The first and second switches Q7 and Q8 are not limited to the MESFET implementation as shown but can be other types of FETs or even bipolar transistors with minor modification.

An input stage circuit 31 has an input for receiving a differential input voltage Vi and a differential output 14, 16 that is coupled to the control nodes 14 and 16 of the first and second switches Q7 and Q8. In a first operational mode, the input stage 31 simultaneously turns on one of the switches to form an on-switch and turns off the other switch to form an off-switch depending upon the polarity of the input voltage Vi. The input stage 31 includes a first differential pair of transistors Q1, Q2 having a differential input formed at the gates of transistors Q1, Q2 for receiving the differential input voltage Vi. A differential output 14, 16 is formed of complementary first and second single-ended outputs at the drains of transistors Q1 and Q2. The single-ended outputs are respectively coupled to the control nodes of the first and second switches Q7 and Q8. A load is coupled to each of the single-ended outputs 14 and 16 such as load current sources 32 and 34. The first differential pair of transistors Q1, Q2 includes a source node 33 that is coupled to a source of bias current such as current source 36.

A tristate disconnect circuit 35 has an input for receiving a tristate selection voltage Vtris and an output coupled to the control nodes 14, 16 of the first and second switches Q7 and Q8. In a second operational mode, disconnect circuit 35 turns off the on-switch in response to a positive tristate selection voltage such that both the first and second switches Q7 and Q8 are off and the output terminal 12 is electrically isolated from the high logic voltage VH and the low logic voltage VL. The disconnect circuit 35 includes a second differential pair of transistors Q5, Q6 having a differential input at the gates thereof coupled to the differential input of the first differential pair of transistors Q1, Q2. A differential output at the drains of transistors Q5 and Q6 is cross-coupled to the differential output of the first differential pair of transistors Q1, Q2. The tristate disconnect circuit 35 includes a third differential pair of transistors Q3, Q4 having a differential input at the bases thereof for receiving the tristate selection voltage Vtris. A differential output is formed of first and second complementary single-ended outputs at the drains of transistors Q3 and Q4 wherein the first single-ended output is coupled to a source node 29 of the second differential pair of transistors Q5, Q6 and the second single-ended output is coupled to a source of constant voltage such as ground. A source of bias current such as tail current source 37 is coupled to a source node 27 of the third differential pair of transistors Q3, Q4.

First and second voltage clamping circuits 41 and 43 are used to voltage clamp the control nodes of the first and second switches Q7, Q8 to a voltage that is more negative than the high logic voltage VH, the low logic voltage VL, or the termination voltage source Vterm in order that switches Q7 and Q8 remain off. Therefore, the first and second switches are voltage-clamped and off regardless of whether VL and VH are switched, and whether Vterm is greater than VH or less than VL. The first voltage clamping circuit 41 includes a first input coupled to the high logic voltage source VH, a second input coupled to the output terminal 12, and an output coupled to the control node 14 of the first switch Q7 for voltage clamping the output to a voltage that is less than the more negative of the termination voltage source Vterm or the high logic voltage source VH. The second voltage clamping circuit 43 includes a first input coupled to the output terminal 12, a second input coupled to the low logic voltage source VL, and an output coupled to the control node 16 of the second switch Q8 for voltage clamping the output to a voltage that is less than the more negative of the termination voltage source Vterm or the low logic voltage source VL.

The first and second voltage clamping circuits 41 and 43 each include a first and second voltage clamp portion. Each voltage clamp portion includes: a unity gain buffer amplifier 42, 44, 46, 48 having an input that forms the input of the voltage clamp; a diode D1, D2, D3, D4 wherein the anode forms the output of the voltage clamp; and voltage dropping means 52, 54, 56, 58 coupled between the output of the respective unity gain buffer amplifier and the cathode of the respective diode. The first and second voltage clamping circuits 41 and 43 also include a diode D6, D5 that is coupled to the output of the respective voltage clamp. The cathode of diode D6, D5 forms the output of the respective first and second voltage clamping circuit 41 and 43. A bias current source 38, 39 is coupled to the output of the respective voltage clamp.

In operation, the input stage circuit 31 includes transistors Q1 and Q2 that form a differential pair of transistors with a tail current source 36 having a value of 2I1 and load current sources 32, 34 each having a value of I1. It is desirable that the load current sources 32, 34 match each other exactly and that the tail current source 36 is exactly equal to twice the value of each load current source. The drains of transistors Q1 and Q2 drive the gates of corresponding output transistors Q7 and Q8, which act as switches to couple the output terminal 12 to either the high logic voltage source VH of the low logic voltage source VL according to whether the differential input voltage Vi is high or low. The load resistor 18 is coupled to the termination voltage source Vterm, which can be greater than VH or less than VL. In some applications, it may be desirable to include a series resistor (not shown) between the output terminal 12 and load resistor 18 to form an output resistance such as the 50 ohm characteristic impedance of a transmission line.

The operation of the tristate disconnect circuit 35 is controlled by the polarity of the tristate selection voltage, Vtris. When Vtris is low, transistor Q3 is off and Q4 steers all of the tail current 2I1 from tail current source 37 to ground. In this case there is no current flowing in transistors Q5 and Q6 and therefore there is no significant impact on the first, connected mode of the driver circuit. When Vtris is high, Q3 steers all of the current equal to 2I1 to the second differential pair of transistors formed by Q5 and Q6. Transistors Q5 and Q6 are cross-coupled in such a manner that the current 2I1 is directed to the drain of transistor Q1 or Q2, whichever is not conducting. Thus, a current equal to I1 pulls the control nodes 14 and 16 (gates) of switches Q7 and Q8 negative. The voltage on node 14 or 16 decreases in a smooth and fast manner such that the switch that was previously on in the first connected mode turns off. Thus, both switches Q7 and Q8 are off in the second disconnected or tristate mode without introducing undesirable voltage spikes or glitches to the output terminal 12. This is because only one on-switch has to turn off instead of two on-switches turning off simultaneously.

The voltage at control nodes 14 or 16 becomes more negative when either one of switches Q7 or Q8 turns off in the first, connected mode or at both control nodes when the tristate mode is selected. It is therefore desirable that these nodes be clamped to a predetermined voltage. The clamp voltage must be sufficiently negative to ensure that the switches Q7 and Q8 remain off in the tristate mode, but not so negative that the drain-to-source voltages of transistors Q1-Q4 collapse. The exact value of the drain-to-source voltage of transistors Q1-Q4 is determined by the clamp voltage of clamping circuits 41 and 43 and the value of the negative power supply voltage VSS. If the drain-to-source voltage becomes too small the switching time of transistors Q1-Q4 increases and glitches at the output terminal 12 can also appear.

In the operation of voltage clamping circuits 41 and 43, the gate-to-source voltages of switches Q7 and Q8 are clamped at a predetermined value of V1 volts. Thus, the voltage dropping means 52-58 are typically set to $-2$ volts if the pinch-off voltage, Vp, for switches Q7 and Q8 is about $-0.7$ volts. The voltage clamping circuits 41 and 43 are designed to accommodate the symmetrical nature of FETs. In some instances it may be desirable to switch VH and VL, in which case the drains and sources of switches Q7 and Q8 are reversed. The ability to interchange VH and VL is a desirable added feature of driver circuit 30, but requires that voltage clamping circuits 41 and 43 effectively voltage clamp switches Q7 and Q8 for all values of VH, VL, and Vterm.

Thus, buffer amplifiers 42-48 track the voltage at the source and drain of switches Q7 and Q8. The output of buffer amplifiers 42-48 is level-shifted down by a voltage of $-V1$ volts through voltage dropping means 52-58. Each voltage dropping means 52-58 is coupled to the cathode of a diode D1-D4. The anodes of diodes D1-D2 are coupled to current source 38 and the anode of diode D6. The anodes of diodes D3-D4 are coupled to current source 39 and the anode of diode D5. The voltage at the junction of the three anodes of each group of diodes is equal to the most negative of the drain and source voltage of each switch Q7 and Q8 minus the voltage V1 of the voltage dropping means plus the voltage across one of the diodes D1–D4 (Vd). In the tristate mode, diodes D6 and D5 each conduct the current equal to I1 that pulls control nodes 14 and 16 negative as explained above. The voltage at the cathode of diodes D6 and D5 is approximately equal to the minimum of the drain and source voltages of switches Q7 and Q8 minus the voltage of the voltage dropping means, V1. Diodes D6 and D5 subtract out the diode voltage of diodes D1–D4. In voltage clamping circuit 41, diodes D1 and D2 act as a minimum voltage detector or a negative analog OR circuit. Diode D6 acts as a switch to disconnect the clamp circuit from control node 14 if switch Q7 is on. A similar analysis can be made for voltage clamping circuit 43.

The following examples help in obtaining a greater understanding of the operation of voltage clamping circuits 41 and 43. In Examples 1–3, the tristate mode is selected and thus both control nodes 14 and 16 are voltage clamped and transistors Q7 and Q8 are off. The value of the termination voltage, Vterm, is selected to be between VH and VL in Example 1, greater than VH in Example 2, and less than VL in Example 3. The following voltages are assumed for all three Examples: $V1 = 2$ volts; $Vp = -0.7$ volts; $Vd = 0.7$ volts; $VDD = 10$ volts; $VSS = -10$ volts; $VH = 5$ volts; and $VL = 0$ volts.

EXAMPLE 1

Vterm = Vout = 2.5 volts

D1 Cathode = 3 volts, D2 Cathode = 0.5 volts
D3 Cathode = 0.5 volts, D4 Cathode = −2 volts
D6 Anode = 1.2 volts, D1 is OFF, D2 is ON
D5 Anode = −1.3 volts, D3 is OFF, D4 is ON
Therefore
  V(14) = 0.5 volts and
  V(16) = −2 volts

EXAMPLE 2

Vterm = Vout = 7.5 volts

D1 Cathode = 3 volts, D2 Cathode = 5.5 volts
D3 Cathode = 5.5 volts, D4 Cathode = −2 volts
D6 Anode = 3.7 volts, D1 is ON, D2 is OFF
D5 Anode = −1.3 volts, D3 is OFF, D4 is ON
Therefore
  V(14) = 3 volts and
  V(16) = −2 volts

EXAMPLE 3

Vterm = Vout = −2.5 volts

D1 Cathode = 3 volts, D2 Cathode = −4.5 volts
D3 Cathode = −4.5 volts, D4 Cathode = −2 volts
D6 Anode = −3.8 volts, D1 is OFF, D2 is ON
D5 Anode = −3.8 volts, D3 is ON, D4 is OFF
Therefore
  V(14) = −4.5 volts and
  V(16) = −4.5 volts Note that in examples 1 and 2, the control nodes 14 and 16 are voltage clamped to two volts less than the more negative of the source and drain of the respective switch Q7, Q8, and that these voltages are different. However, in example 3 the control nodes 14 and 16 are voltage clamped to the same voltage since Vterm is less than either VH or VL. In all cases, switches Q7 and Q8 are turned off and there is no possibility of Vterm causing an inadvertent current flow.

Although the voltage clamping above has been illustrated with voltage V1 equal to 2 volts, it is important to note that this voltage can be adjusted to any voltage, positive or negative. The clamping voltage is adjusted to accommodate the switching characteristics of any type of depletion or enhancement FETs, or bipolar transistors to ensure that the first and second switches Q7 and Q8 remain off in the tristate mode.

Figure 6:
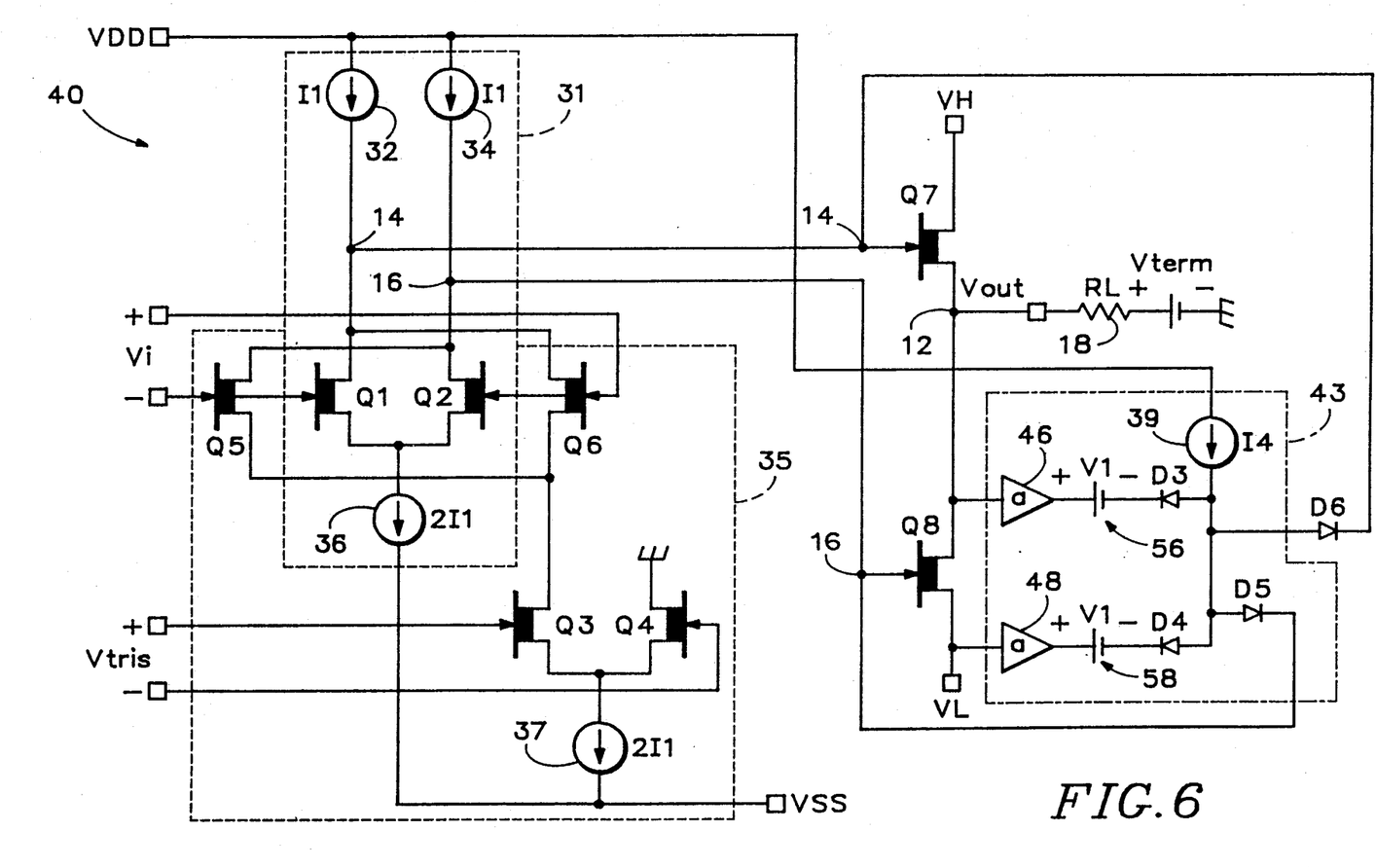
FIG. 6 is a schematic diagram of a tristate driver circuit according to another embodiment of the present invention.

Another embodiment of the present invention is shown in FIG. 6 that is possible if VH is assumed to be greater than VL. If this assumption is true, it is sufficient to determine the minimum voltage of VL and Vout and clamp the control nodes 14 and 16 of switches Q7 and Q8 below this minimum voltage by V1 volts. Thus, in driver circuit 40, voltage clamping circuit 4 is eliminated in FIG. 6 except for diode D6. Separate diodes D5 and D6 are still required to selectively voltage isolate the control node 14 or 16 of the switch that is on from the clamping voltage in the first, connected mode.

Figure 7:
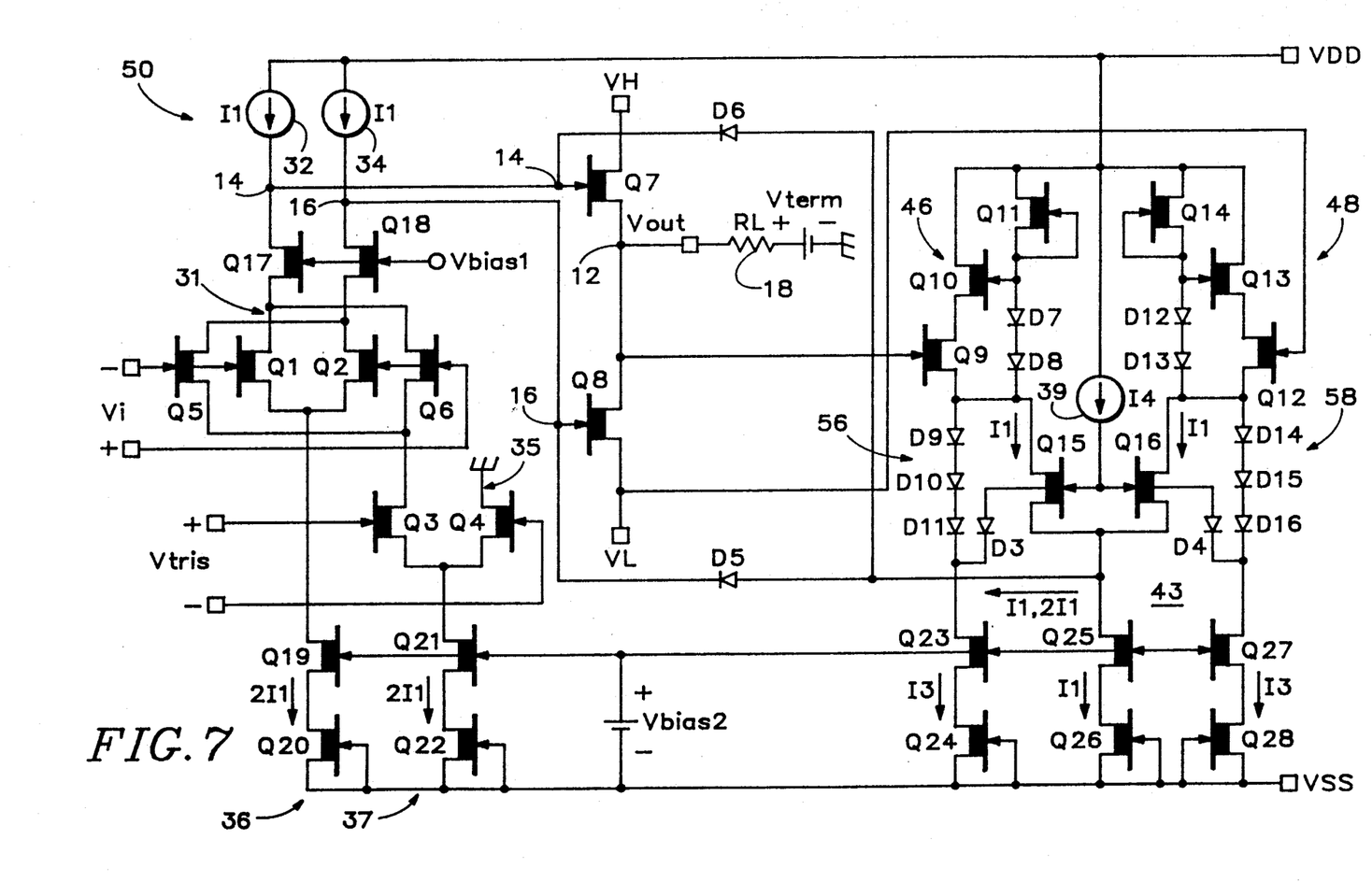
FIG. 7 is a more detailed schematic diagram of the circuit of FIG. 6.

A more detailed schematic of the embodiment of FIG. 6 is shown in FIG. 7. Driver circuit 50 includes a practical implementation of the voltage clamping circuit 43, current sources 36 and 37, and additional cascode output circuitry in the differential output of the first differential pair of transistors Q1 and Q2.

Thus, the voltage clamping circuit shown generally at 43 includes buffer amplifiers 46 and 48, voltage dropping means 56 and 58, and diodes D3–D6. Buffer amplifier 46 includes transistors Q9–Q11 and diodes D7–D8 and buffer amplifier 48 includes transistors Q12–Q14 and diodes D12–D13. Transistors Q9–Q10 and Q12–Q13 form bootstrapped source followers whereby the drain-to-source voltages of transistor Q9 and Q12 are maintained at a substantially constant voltage. Transistors Q11 and Q14 are configured as current sources to bias diodes D7–D8 and D12–D13. Voltage dropping means 56 includes diodes D9–D11, and voltage dropping means 58 includes diodes D14–D16. Diodes D3–D6 correspond to the same diodes in FIG. 6.

Additional circuitry not shown in FIG. 6 includes transistors Q15 and Q16 configured as buffer amplifiers operated near $I_{dss}$ to maintain gate-to-source voltages of approximately zero volts. The current flowing through transistors Q15 and Q16 maintains a relatively constant current flow through transistors Q9 and Q12. Relatively constant gate-to-source voltages are also maintained independent of whether or not control nodes 14 or 16 are being voltage clamped. If the current through transistors Q9 and Q12 is allowed to vary substantially, the corresponding change in gate-to-source voltage modulates the value of the clamping voltage V1 in an undesirable manner. For example, if V1 changes from −2 volts closer to −0.6 volts, it is possible that a depletion MESFET switch can begin conducting current. Cascode current sources formed of transistors Q23–Q24, transistors Q25–Q26, and transistors Q27–Q28 are used to provide a high impedance current to bias voltage dropping means 56, transistors Q15–Q16, and voltage dropping means 58, respectively.

In FIG. 7, tail current sources 36 and 37 have been replaced by high impedance cascode current sources formed of transistors Q19–Q20 and transistors Q21–Q22, respectively. Cascoding of the current sources improves matching as well as increases output impedance. In addition, the first and second differential pairs of transistors Q1–Q2 and Q5–Q6 are cascoded by transistors Q17–Q18 to increase output impedance.

Figure 8:
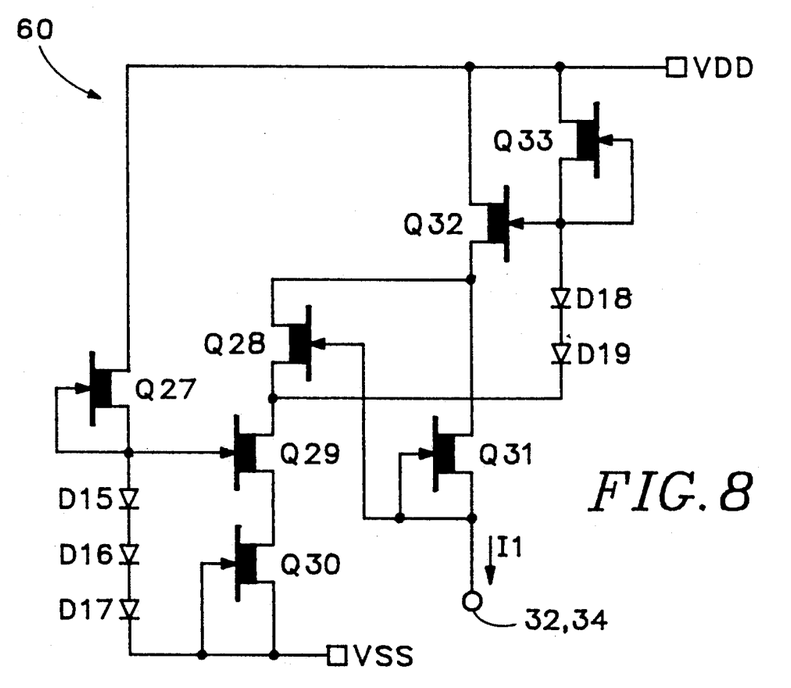
FIG. 8 is a detailed schematic of a bootstrapped current source suitable for use in either embodiment of the present invention.

As previously noted, it is highly desirable that load current sources 32 and 34 match each other and that tail current source 36 is twice the value of one of the load current sources. This accuracy overcomes the multiple slope problem of the prior art driver circuits. Thus FIG. 8 shows a bootstrapped current source 60 that is suitable for use as load current sources 32 and 34. The accuracy of current source 60 is maintained even if the positive power supply voltage source VDD is modulated. Transistor Q31 is a depletion current source having a value of I1. Transistor Q31 is bootstrapped by transistor Q28, transistor Q32, and related biasing circuitry to maintain a substantially constant drain-to-source voltage. Transistors Q27, Q29, and Q30 as well as diodes D15–D17 provide the proper current and voltage biasing for transistor Q28. Transistors Q33 and diodes D18–D19 provide the constant voltage biasing for the proper drain-to-source voltage of transistor Q31.

The improvements in the present invention are due in part, as explained, because of the bootstrapped current sources and cascode stages used in the differential transistor pair outputs and current sources. It is apparent to those skilled in the art that many changes can be made in the design of a bootstrapped current source and a cascode stage. At a minimum, a cascode stage includes an additional transistor such as Q19 in FIG. 7, wherein the gate is returned to a source of constant voltage such as Vbias1 or Vbias2. At a minimum, a bootstrapped current source includes a means for creating a constant drain-to-source voltage across a current source transistor such as Q31 in FIG. 8.

Accordingly, while preferred embodiments of the present invention have been shown and described, it is apparent to those skilled in the art that many changes and modifications can be made without departing from the invention in its broader aspects. For example, bipolar transistors can be substituted for the FETs shown in the drawing figures with minor modification. We claim all modifications coming within the spirit and scope of the accompanying claims.

We claim:

1. A tristate output driver circuit (40) comprising:
    an output terminal (12) having an associated output voltage;
    a load (18) coupled between the output terminal and a termination voltage source;
    a first switch (Q7) coupled between a first voltage source and the output terminal, the first switch including a control node;
    a second switch (Q8) coupled between a second voltage source and the output terminal, the second switch including a control node;
    means (31) coupled to the control nodes of the first and second switches for simultaneously turning on one of the switches and turning off the other switch to form an on-switch and an off-switch responsive to the polarity of a differential input voltage in a first operational mode;
    means (35) coupled to the control nodes of the first and second switches for turning off the on-switch in a second operational mode such that both the first and second switches are off; and
    means (43) having a first input coupled to the output terminal, a second input coupled to the second voltage source, and first and second outputs respectively coupled to the control nodes of the first and second switches for voltage clamping the first and second outputs to a voltage that is equal to the more negative of the output voltage and the second voltage source plus a predetermined voltage.

2. A tristate output driver circuit as in claim 1 in which the means (31) for simultaneously turning on one of the switches and turning off the other of the switch comprises:
    a first differential pair of transistors (Q1, Q2) having a differential input for receiving the differential input voltage, a differential output formed of first and second single-ended outputs respectively coupled to the control nodes of the first and second switches, and a source node;
    bias means (36) coupled to the source node; and
    load means (32, 34) coupled to the differential output.

3. A tristate output driver circuit as in claim 2 in which the first differential pair of transistors (Q1, Q2) includes a cascode output stage (Q17, Q18).

4. A tristate output driver circuit as in claim 2 in which the load means (32, 34) comprises first and second equal-valued bootstrapped load current sources (60) respectively coupled to the first and second single-ended outputs.

5. A tristate output driver circuit as in claim 2 in which the bias means (36) comprises a cascoded tail current source (Q19, Q20).

6. A tristate output driver circuit as in claim 2 in which the load means (32, 34) comprises first and second equal-valued bootstrapped load current sources (60) respectively coupled to the first and second single-ended outputs and the bias means (36) comprises a cascoded tail current source (Q19, Q20) having a value equal to twice that of one of the first and second load current sources.

7. A tristate output driver circuit as in claim 1 in which the means (35) for turning off the on-switch comprises:
    a second differential pair of transistors (Q5, Q6) having a differential input coupled to the differential input of the first differential pair of transistors, a source node, and a differential output cross-coupled to the differential output of the first differential pair of transistors;
    a third differential pair of transistors (Q3, Q4) having a differential input for receiving a tristate selection voltage, a source node, and a differential output formed of first and second single-ended outputs wherein the first single-ended output is coupled to the source node of the second differential pair of transistors and the second single-ended output is coupled to a source of constant voltage; and
    bias means (37) coupled to the source node of the third differential pair of transistors.

8. A tristate output driver circuit as in claim 7 in which the bias means (37) comprises a cascoded tail current source (Q21, Q22).

9. A tristate output driver circuit as in claim 1 in which the means (43) for voltage clamping comprises:
    a bias node;
    a first voltage clamp (46, 56, D3) having an input forming the first input of the voltage clamping means and an output coupled to the bias node;
    a second voltage clamp (48, 58, D4) having an input forming the second input of the voltage clamping means and an output coupled to the bias node;
    a first diode (D6) coupled between the bias node and the first output of the voltage clamping means;

a second diode (D5) coupled between the bias node and the second output of the voltage clamping means; and a bias current source (39) coupled to the bias node.

10. A tristate output driver circuit as in claim 9 in which each of the first and second voltage clamps comprise:
- a unity gain buffer amplifier (46, 48) having an input forming the input of the voltage clamp and an output;
- a diode (D3, D4) having a cathode and an anode forming the output of the voltage clamp; and
- voltage dropping means (56, 58) coupled between the output of the unity gain buffer amplifier and cathode of the diode.

11. A tristate output driver circuit (30) comprising:
- an output terminal (12) having an associated output voltage;
- a load (18) coupled between the output terminal and a termination voltage source;
- a first switch (Q7) coupled between a first voltage source and the output terminal, the first switch including a control node;
- a second switch (Q8) coupled between a second voltage source and the output terminal, the second switch including a control node;
- means (31) coupled to the control nodes of the first and second switches for simultaneously turning on one of the switches and turning off the other switch to form an on-switch and an off-switch responsive to the polarity of a differential input voltage in a first operational mode;
- means (35) coupled to the control nodes of the first and second switches for turning off the on-switch in a second operational mode such that both the first and second switches are off;
- first means (41) having a first input coupled to the first voltage source, a second input coupled to the output terminal, and an output coupled to the control node of the first switch for voltage clamping the output to a voltage that is equal to the more negative of the output voltage and the first voltage source plus a predetermined voltage; and
- second means (43) having a first input coupled to the output terminal, a second input coupled to the second voltage source, and an output coupled to the control node of the second switch for voltage clamping the output to a voltage that is equal to the more negative of the output voltage and the second voltage source plus a predetermined voltage.

12. A tristate output driver circuit as in claim 11 in which the means (31) for simultaneously turning on one of the switches and turning off the other of the switch comprises:
- a first differential pair of transistors (Q1, Q2) having a differential input for receiving the differential input voltage, a differential output formed of first and second single-ended outputs respectively coupled to the control nodes of the first and second switches, and a source node;
- bias means (36) coupled to the source node; and
- load means (32, 34) coupled to the differential output.

13. A tristate output driver circuit as in claim 12 in which the first differential pair of transistors (Q1, Q2) includes a cascode output stage (Q17, Q18).

14. A tristate output driver circuit as in claim 12 in which the load means (32, 34) comprises first and second equal-valued bootstrapped load current sources (60) respectively coupled to the first and second single-ended outputs.

15. A tristate output driver circuit as in claim 12 in which the bias means (36) comprises a cascoded tail current source (Q19, Q20).

16. A tristate output driver circuit as in claim 12 in which the load means (32, 34) comprises first and second equal-valued bootstrapped load current sources (60) respectively coupled to the first and second single-ended outputs and the bias means (36) comprises a cascoded tail current source (Q19, Q20) having a value equal to twice that of one of the first and second load current sources.

17. A tristate output driver circuit as in claim 11 in which the means (35) for turning off the on-switch comprises:
- a second differential pair of transistors (Q5, Q6) having a differential input coupled to the differential input of the first differential pair of transistors, a source node, and a differential output cross-coupled to the differential output of the first differential pair of transistors;
- a third differential pair of transistors (Q3, Q4) having a differential input for receiving a tristate selection voltage, a source node, and a differential output formed of first and second single-ended outputs wherein the first single-ended output is coupled to the source node of the second differential pair of transistors and the second single-ended output is coupled to a source of constant voltage; and
- bias means (37) coupled to the source node of the third differential pair of transistors.

18. A tristate output driver circuit as in claim 17 in which the bias means (37) comprises a cascoded tail current source (Q21, Q22).

19. A tristate output driver circuit as in claim 11 in which the first and second means (41, 43) for voltage clamping each comprise:
- a bias node;
- a first voltage clamp (42, 52, D1; 46, 56, D3) having an input forming the first input of the voltage clamping means and an output coupled to the bias node;
- a second voltage clamp (44, 54, D2; 48, 58, D4) having an input forming the second input of the voltage clamping means and an output coupled to the bias node;
- a diode (D6, D5) coupled between the bias node and the output of the voltage clamping means; and
- a bias current source (38, 39) coupled to the bias node.

20. A tristate output driver circuit as in claim 19 in which each of the first and second voltage clamps comprise:
- a unity gain buffer amplifier (42-48) having an input forming the input of the voltage clamp and an output;
- a diode (D1-D4) having a cathode and an anode forming the output of the voltage clamp; and
- voltage dropping means (52-58) coupled between the output of the unity gain buffer amplifier and cathode of the diode.

21. A method for providing a tristate output, the method comprising the steps of:
- coupling a first switch between a first voltage source and an output terminal, the output terminal having an associated output voltage and the first switch including a control node;

coupling a second switch between a second voltage source and the output terminal, the second switch including a control node;

coupling the output terminal to a termination voltage source through a load;

simultaneously turning on one of the switches and turning off the other switch to form an on-switch and an off-switch responsive to the polarity of a differential input voltage in a first operational mode;

turning off the on-switch in a second operational mode such that both the first and second switches are off;

voltage clamping the control node of the first switch in the second operational mode to a voltage that is equal to the more negative of the first voltage source and the output voltage plus a predetermined voltage; and voltage clamping the control node of the second switch in the second operational mode to a voltage that is equal to the more negative of the second voltage source and the output voltage plus a predetermined voltage.

22. A method for providing a tristate output as in claim 21 including the step of voltage clamping the control node of the off-switch in the first operational mode to a voltage that is equal to the more negative of the first voltage source and the output voltage plus a predetermined voltage when the off-switch is the first switch and to a voltage that is equal to the more negative of the second voltage source and the output voltage plus a predetermined voltage when the off-switch is the second switch.

23. A method for providing a tristate output, the method comprising the steps of:

coupling a first switch between a first voltage source and an output terminal, the output terminal having an associated output voltage and the first switch including a control node;

coupling a second switch between a second voltage source and the output terminal, the second switch including a control node;

coupling the output terminal to a termination voltage source through a load;

selecting the first and second voltage sources such that the voltage of the first voltage source is greater than the voltage of the second voltage source;

simultaneously turning on one of the switches and turning off the other switch to form an on-switch and an off-switch responsive to the polarity of a differential input voltage in a first operational mode;

turning off the on-switch in a second operational mode such that both the first and second switches are off; and voltage clamping the control nodes of the first and second switches in the second operational mode to a voltage that is equal to the more negative of the second voltage source and the output voltage plus a predetermined voltage.

24. A method for providing a tristate output as in claim 23 including the step of voltage clamping the control node of the off-switch in the first operational mode to a voltage that is equal to the more negative of the second voltage source and the output voltage plus a predetermined voltage.

* * * * *